United States Patent [19]
Puckette et al.

[11] 3,973,138
[45] Aug. 3, 1976

[54] BUCKET BRIGADE TRANSVERSAL FILTER

[75] Inventors: Charles M. Puckette; Walter J. Butler, both of Scotia, N.Y.

[73] Assignee: General Electric Company, Schenectady, N.Y.

[22] Filed: May 5, 1975

[21] Appl. No.: 574,239

[52] U.S. Cl. .......................... 307/221 D; 307/304; 333/70 T; 357/24
[51] Int. Cl.² .................. G11C 19/18; G11C 19/28
[58] Field of Search .......... 357/24; 307/221 D, 304

[56] References Cited
UNITED STATES PATENTS

| | | | |
|---|---|---|---|
| 3,790,825 | 2/1974 | Barron et al. | 357/24 |
| 3,819,958 | 6/1974 | Gosney | 307/221 D |
| 3,868,516 | 2/1975 | Buss | 357/24 |
| 3,877,056 | 4/1975 | Bailey | 357/24 |
| 3,903,543 | 9/1975 | Smith | 357/24 |

OTHER PUBLICATIONS

Heller, "Bucket Brigade Delay Line . . . ", IBM Technical Disclosure Bulletin, vol. 13, No. 12, May from the pp. 3734–3735.

*Primary Examiner*—William D. Larkins
*Attorney, Agent, or Firm*—Stephen B. Salai; Joseph T. Cohen; Jerome C. Squillaro

[57] ABSTRACT

A charge transfer sampled data transversal filter includes a bucket-brigade delay line having a plurality of charge storage locations. Time delayed samples are derived from those locations by non-destructive sampling techniques. The magnitudes of the samples are determined by the value of the capacitors at each charge storage location.

6 Claims, 5 Drawing Figures

BUCKET BRIGADE TRANSVERSAL FILTER

This invention relates, in general, to bucket brigade delay lines, and more particularly to bucket brigade delay lines having capacitive charge storage locations of pre-selected magnitudes for use in transversal filter applications.

Charge transfer devices, including bucket brigade delay lines, are well suited to a number of analog signal processing functions. The use of bucket brigade devices as delay lines is well known in the art. This invention is concerned with the use of bucket brigade delay lines in transversal filters. The use of charge transfer devices including bucket brigade delay lines in transversal filtering applications has been described, for example, by Buss et al, "TRANSVERSAL FILTERING", *IEEE Journal of Solid State Circuits*, April 1973, Vol. S.C. —8 Number Two, Pages 138-146.

Generally, a charge transfer transversal filter, (including a charge coupled device), includes a sampling stage followed by a plurality of delay stages. The outputs of the delay stages are non-destructively sampled, each output is multiplied by an appropriate pre-selected weighting coefficient, and the weighted outputs are summed to provide an output signal which is a function of the input signal, the function being determined by the weighting coefficients. A number of methods for providing the required weighting function have been proposed. For example, Buss et al, describe two methods, a first method wherein the electrodes of a charge coupled device are physically divided into two portions, the relative size of the portions determining the weighting function; and a second method wherein an auxiliary transistor is connected to each node, the weighting being determined by the transconductance of the auxiliary transistor.

Where it is unnecessary to provide the weighting function on the bucket brigade delay line chip, external circuitry of well known design may be provided for weighting and summing the sampled outputs of the bucket brigade stages.

The two aforementioned weighting methods are suited to on-chip implementation. Both, however, suffer from certain disadvantages. For example, the use of individual output transistors at each node, the transconductance of the transistors being determined by the terminal voltages thereof, is difficult to implement in that it may be necessary to provide an external connection to the device for each such transistor. Where a substantial number of nodes is involved, this may require a device with a large if not prohibitive number of terminals. The split electrode technique becomes undesirable when the value of the weighted part of the storage capacitance approaches the total depletion capacitance and/or fringing capacitance of a given node. As this happens, the non-linearity of the device increases to what may be an intolerable level.

It is an object of this invention to provide a bucket brigade delay line and weighting structure for use in a transversal filter, which overcomes these disadvantages and is easy to implement, does not require an excessive number of connections thereto, and which overcomes the non-linearity problem attendant to split electrode weighting methods.

Briefly stated and in accordance with one aspect of this invention, a bucket brigade delay line is provided having a plurality of stages each of which includes at least one storage capacitor and a semiconductor switch associated therewith. The storage capacitors are selected to have a capacitance such that a desired transfer function may be obtained by summing the voltages across the aforementioned storage capacitors. Each of the selected storage capacitors has a capacitance larger than the sampling capacitor of the delay line.

Figure 1:
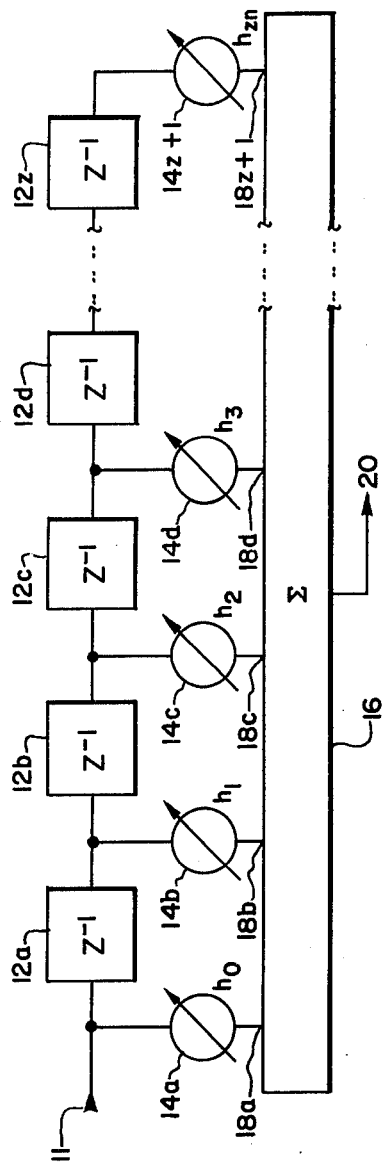
FIG. 1 is a block diagram of a transversal filter of the type with which this invention is concerned, shown in generalized form.

FIG. 1 illustrates in generalized form, and utilizing $z$ notation, wherein $z = e^{j \omega T}$, a sampled data transversal filter. The filter of FIG. 1 includes an input 11 connected to a plurality of serially arranged unit delay stages 12$a$ through 12$z$, the output of each unit delay stage being connected to the input of the following unit delay stage. A plurality of weighting stages 14$a$ through 14$z$+1, the precise number of such stages being determined by the application and desired characteristics of the filter and not limited to any specific number, are connected to the delay stages. Weighting stages 14$a$ through 14$z$+1 are nondestructive sampling stages. It is to be understood therefore that the sample appearing at input 11 which is applied to time delay stages 12 and weighting stages 14 appears substantially undiminished in amplitude and unaltered in waveform save only for the time delay, at the output of time delay stage 12$z$. Summer 16 has a plurality of inputs 18$a$ through 18$z$+1 equal to the number of weighting stages 14 and an output 20 which is the output of the transversal filter. Each of the weighting stages 14 is assigned a weighting transfer function $h_k$ which describes the ratio of the input of the weighting stage to the output thereof. For the case of a linear phase filter, the number of weighting stages is an odd integer and $h_k = h_{2n-k}$. It follows therefore that since the number of time delay stages 12 is one less than the number of weighting stages 14, the number of time delay stages is an even integer.

The overall transfer function of the transversal filter hereinabove described is equal to:

$$G(z) = \sum_{k=o}^{2n} h_k z^{-k}$$

where $z^{-1}$ represents a unit time delay as hereinabove described. The frequency response of the filter may be obtained by substituting $$z = e^{j \omega T} = e^{j 2 \pi F}$$

where $F$ is the normalized frequency variable $$F = \frac{\omega T}{2\pi}.$$

It is seen therefore that $$G(F) = \underbrace{e^{-j2\pi nF}}_{\text{phase}} \underbrace{\sum_{k=o}^{h} d_k \cos 2k\pi F}_{\text{magnitude}}$$

wherein the phase and magnitude of the frequency response are as indicated. It can be seen that the magnitude of the frequency response at any given frequency is determined by the coefficient $d_k$. Proper selection of $d_k$ or equivalently of the weighting coefficients $h_k$ will yield any desired transfer function.

The methods for determining the weighting coefficients are well known to those skilled in the art and will not therefore be extensively described herein. For example, see Parks and McClellan, "Chebyshev Approximation for Non-recursive Digital Filters With Linear Phase", *IEEE Transactions on Circuit Theory*, Volume CT-19, Number 2, pages 189–194, March 1972, the contents of which are herein incorporated by reference.

It is emphasized that this invention relies on no particular method for determining the weighting coefficients. The article hereinabove referenced is included as exemplary only, and reference may equally well be made to any method for determining weighting coefficients as might be utilized in accordance with any of the prior art methods for implementing weighting in transversal filters of the type hereinabove described.

Figure 2:
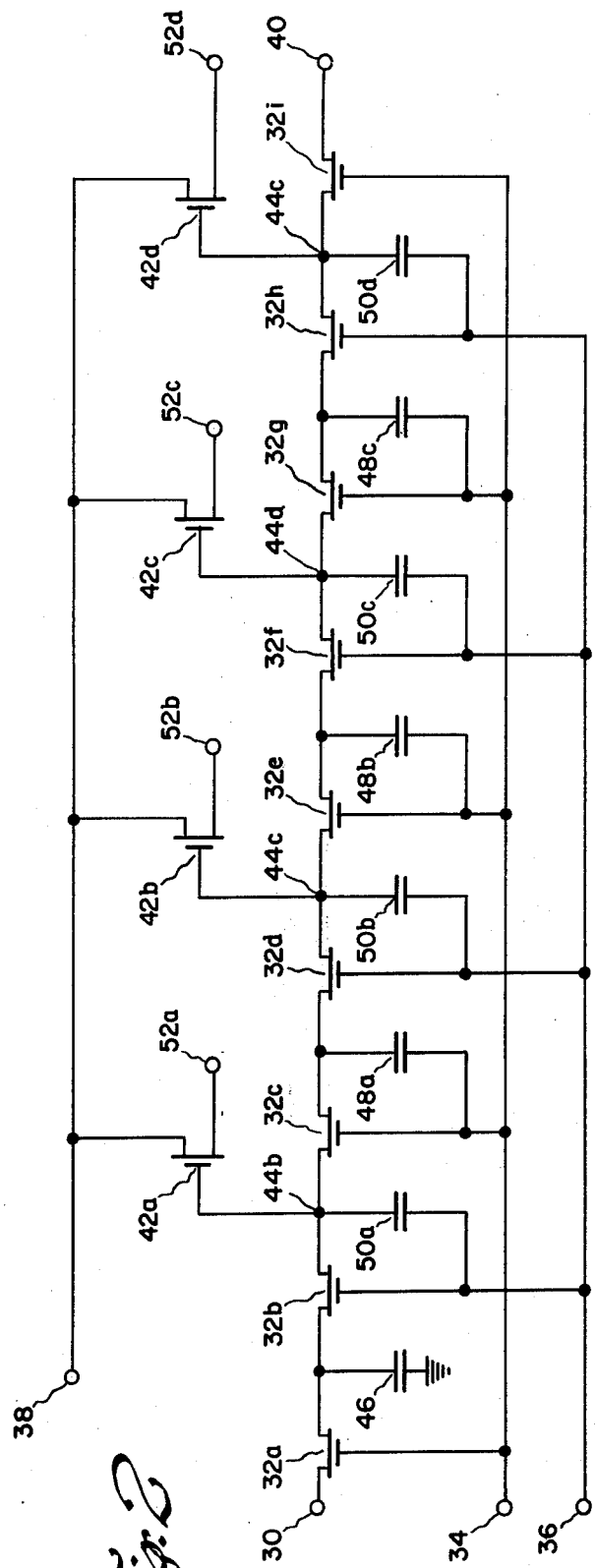
FIG. 2 is a schematic diagram of a bucket brigade delay line in accordance with this invention.

FIG. 2 is a schematic diagram of an exemplary embodiment of this invention. An input terminal 30 connected to a first switching transistor 32a which may conveniently be a Junction Field Effect Transistor, JFET, or Metal-Oxide-Semiconductor Field Effect Transistor, a MOSFET, is adapted to be connected to an analog signal source. First and second clock input terminals 34 and 36 are adapted to be connected to a two phase clock generator (not illustrated). Terminal 40 is adapted to be connected to a source of precharge voltage. Nondestructive sampling transistors 42a, b, c and d are attached to nodes 44b, c, d and e, respectively, and provide at the outputs thereof voltage samples proportional to the voltages appearing at each of nodes 44b–e, respectively. It will be appreciated that the schematic diagram of FIG. 2 illustrates a conventional form of bucket brigade delay line, and that the invention disclosed herein lies in the particular selection of storage capacitor values as hereinbelow described.

The delay line of FIG. 2 includes a plurality of capacitors which may be divided into two general groups. A first group includes sampling capacitor 46 and storage capacitors 48a, 48b and 48c. A second group includes storage capacitorss 50a, 50b, 50c and 50d. Switching transistors 32b through h are operative when appropriately energized to transfer charge from one storage capacitor to another.

In accordance with this invention, input sampling capacitor 46 and storage capacitors 48a, 48b and 48c are of a first capacitance, the magnitude of which may be more or less arbitrarily selected depending upon the physical construction of the particular bucket brigade delay line in accordance with principles well known to those skilled in the art. Storage capacitances 50a, 50b, 50c and 50d are of selected capacitance value which in no case is less than the capacitance value of previously mentioned sampling capacitor 46 and storage capacitors 48a–c. Further, capacitors 50a–d are selected to provide a node voltage at nodes 44b–e which voltages are in the same proportions as the weighting coefficients hereinabove described.

By way of example, assume that outputs 52a–d are required to have the relative weighting coefficients 1.0, 0.5, 0.25, and 0.1, respectively. These weighting coefficients may be achieved by choosing the following capacitor sizes: capacitor 46=48a =48b=48c and capacitor 50a=46, 50b=46(1/0.5), 50c=46(1/0.25) and 50d=46(1/0.1). It will be recalled that in conjunction with the discussion of FIG. 1, it was pointed out that the number of inputs to summer 16 thereof would always be odd for linear phase filters. It will be noted that FIG. 2 includes an even number of outputs 52a–d and it is pointed out that FIG. 2 is intended to illustrate only a portion of a bucket brigade delay line for purposes of describing the selection of capacitances thereof, and it will be understood that in practice a substantially longer delay line having the aforementioned odd number of output taps would be employed for the implementation of a linear phase transversal filter. Where linear phase is not a requirement, an odd or even number of taps may be employed.

Figure 3:
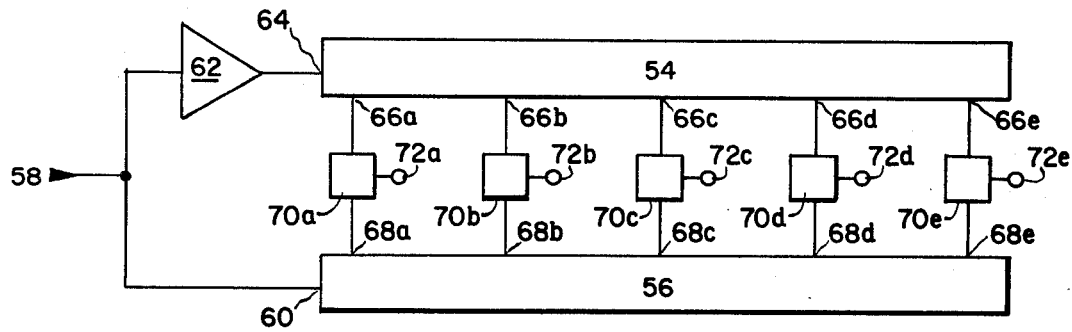
FIG. 3 is a block diagram of a portion of a transversal filter in accordance with this invention.
Figure 4:
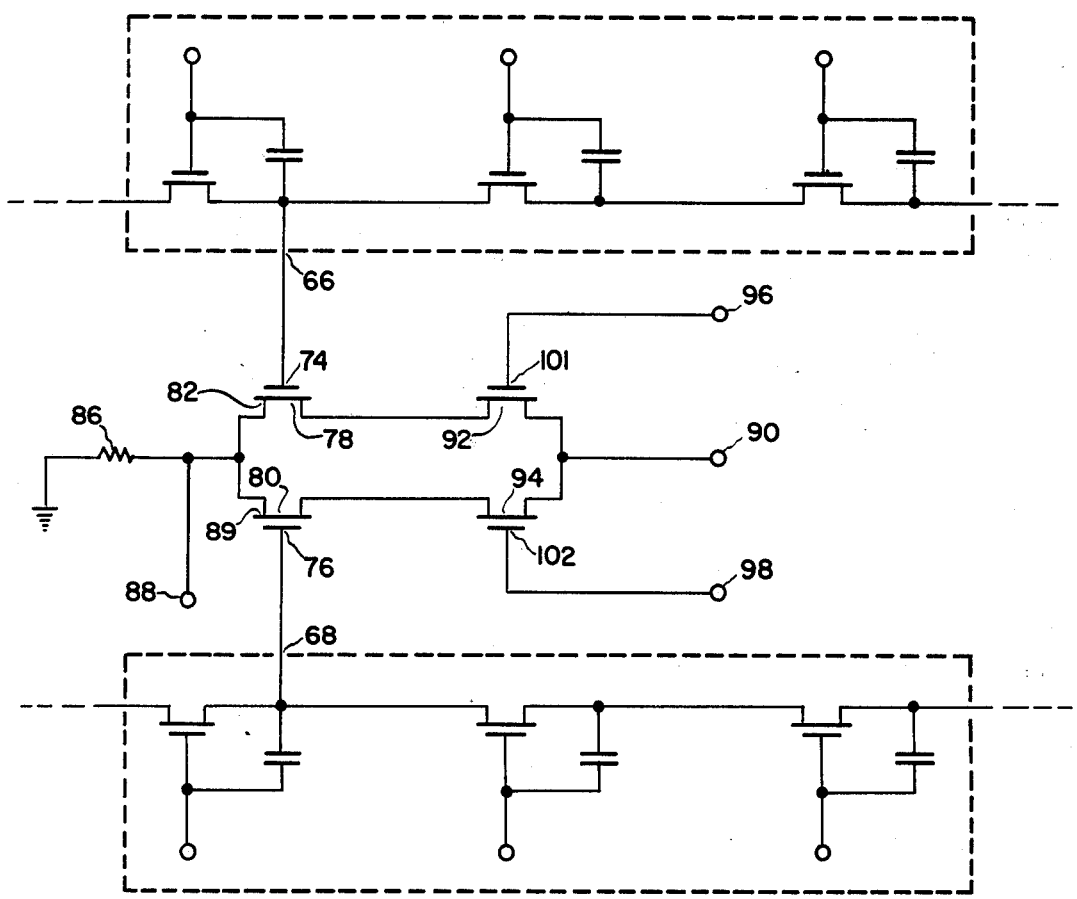
FIG. 4 is a schematic diagram of an exemplary embodiment of a tap in accordance with FIG. 3.

In operation, assume that a first sample appears at capacitor 46 inducing a terminal voltage thereacross equal to $V_1$. When transistor 32b conducts, charge transfers to capacitor 50a and since as hereinabove described, capacitor 50a has the same magnitude of capacitance as capacitor 46, the voltage change appearing at node 44b will be equal to that which occurs across capacitor 46 and which is linearly related to the input signal voltage. Similarly, when the charge is transferred by transistor 32c to capacitor 48a the magnitude of the voltage change will be maintained. When transistor 32d conducts, charge is transferred from capacitor 48a to capacitor 50b. Since capacitor 50b is twice as large as capacitor 48a, the voltage change appearing at node 44c will be ½ or 0.5 times the voltage change appearing across capacitor 46. Similarly, when transistor 32e conducts, charge is transferred from capacitor 50b to capacitor 48b and since capacitor 48b is half as large as capacitor 50b, the voltage change appearing thereacross will be twice the voltage change appearing across capacitor 50b, and therefore be equal to the original voltage change which appeared across capacitor 46. When transistor 32f conducts, charge is transferred from capacitor 48b to capacitor 50c and since capacitor 50c is four times as large as capacitor 48b, the voltage change appearing thereacross will be one-fourth the voltage change which appeared across capacitor 48b which it will be recalled was equal to the voltage change which appeared across capacitor 46. The original signal voltage level is again restored upon the conduction of transistor 32g and the corresponding transfer of charge to capacitor 48c. Finally, when transistor 32h conducts, charge is transferred to capacitor 50b which it will be recalled is 10 times as large as capacitor 48c and therefore the voltage change appearing at node 44e will be one-tenth that which appeared across capacitor 48c. It is seen that the selection of the values for capacitors 50a, 50b, 50c and 50d cause the voltage changes appearing at nodes 44b–e to appear in the desired ratios. It will be appreciated that the signal voltages appearing at the outputs 52a–d of output source followers 42a–d will maintain these ratios.

Where it is desired to employ both positive and negative weighting coefficients, the embodiment of this invention illustrated in FIGS. 3 and 4 may be appropriately utilized. FIG. 3 shows in block diagram form a transversal filter in accordance with this invention wherein two bucket brigade delay lines 54 and 56 each of which is substantially identical to the bucket brigade delay line illustrated in FIG. 2, are employed in a differential configuration. An input 58 is connected both to an input 60 of bucket brigade delay line 56 and to an inverting amplifier 62, the output of which is connected to an input 64 of bucket brigade delay line 54. Inverting amplifier 62 should preferably be chosen to have unity gain so that the signals appearing at inputs 60 and 64 are substantially equal in magnitude but opposite in phase.

It will be appreciated that bucket brigade delay lines 54 and 56 are shown in simplified form having only input terminals 60 and 64 and tap output terminals 66a–e and 68a–e, respectively. It is to be understood that a clock voltage source not shown would be appropriately connected as would sundry other operating voltages. Networks 70a–e determine which of bucket brigade delay lines 54 or 56 will be connected with outputs 17a–e to provide the required positive and negative weighting coefficients.

FIG. 4 illustrates an exemplary method for providing the switching function of networks 70a–e. Referring to FIG. 4 it will be seen that outputs 66 and 68 which are exemplary of any of output 44 of FIG. 2, are connected, respectively, to gates 74 and 76 of transistors 78 and 80 which may conveniently be field effect or MOSFET transistors. Transistors 78 and 80 are connected in parallel source follower configuration, their sources 82 and 84 being connected to a common source resistor 86 which is, in turn, connected to ground. The tap output is obtained across resistor 86 at output terminal 88. Drain voltage for transistors 78 and 80 is supplied thereto from terminal 90 through switching transistors 92 and 94, respectively. Control terminals 96 and 98 supply voltages to the gates 100 and 102, respectively, of switching transistors 92 and 94 to determine which of transistors 78 and 80 will be energized. The polarity of the various voltages applied to transistors 78, 80, 92 and 94 depends upon the conductivity types of those transistors as is well known to those skilled in the art. It will be appreciated, therefore, that by selectively energizing, with the proper voltage, either terminal 96 or 98 the selected one of transistors 78 or 80 is energized and either output 66 or 68 of bucket brigade delay line 54 or 56 is connected with output terminal 88. Since the signal inputs to bucket brigade delay lines 54 and 56 are opposite in phase due to inverting amplifier 62, the tapped outputs 66 and 68 thereof, respectively, will also be inverted in phase, and proper selection thereof provides both positive and negative weighting functions. It is to be understood that terminals 96 and 98 may be remotely energized by switchable means to provide programmable ± weighting which allows a filter configuration which may be varied in response after the physical construction thereof to provide, for example, a programmable correlator.

It is to be understood that the circuit of FIG. 4 hereinabove described is duplicated at each output tap of FIG. 3.

Figure 5:
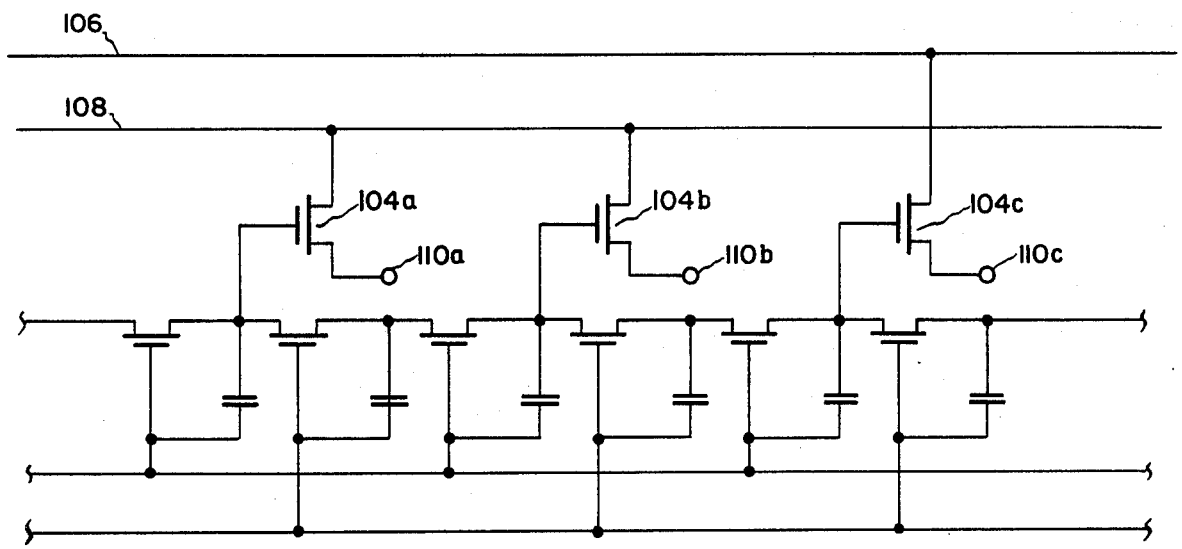
FIG. 5 is a schematic diagram of a means for obtaining positive and negative weighting in accordance with this invention.

While FIGS. 2–4 illustrate several exemplary embodiments of this invention, it is to be understood that the invention is no way limited to the particular embodiments illustrated herein. For example, since in form a bucket brigade delay line in accordance with this invention is substantially similar to previously known bucket brigade delay lines, save only for the particular selection of capacitor values therein, any of the well known output techniques, as for example, positive and negative current summing busses may be utilized. FIG. 5 illustrates in schematic form a bucket brigade delay line having positive and negative current summing busses. It will be noted that only a portion of a bucket brigade delay line is illustrated and, that, in fact, the structure is substantially identical to that of FIG. 2. The structure of FIG. 5 may be distinguished from that of FIG. 2 by noting that the output source followers 104a–c have their drains attached to first and second current summing busses 106 and 108. It can be seen that either of current summing busses 106 and 108 may be suitably connected with an inverting current amplifier to produce an output which is opposite in sign to the other current summing bus thereby yielding both positive and negative weighting coefficients as desired. It is to be understood that where the current summing bus technique of FIG. 5 is utilized that terminal 110a–c will be connected to a suitable voltage source and that the current flowing through the transistor will be determined by the gate voltage thereof.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A transversal filter having predetermined weighting coefficients comprising:
    a bucket brigade delay line of the type having a plurality of serially arranged capacitive charge storage locations connected by semiconductor switches wherein:
    a first plurality of said serially-arranged charge storage locations comprises capacitors of a first capacitance, said first plurality including every other charge storage location of said plurality of serially arranged charge storage locations, and
    a second plurality of charge storage locations comprises capacitors at the remaining capacitive charge storage locations of said plurality of capacitive charge storage locations; said capacitors of said second plurality characterized by capacitances of different selected magnitudes such that the transfer of a given quantity of charge will produce a preselected voltage change at each of said charge storage locations
        said selected magnitudes determined according to said predetermined weighting coefficients,
        said transversal filter further including means summing said voltage changes for providing an output voltage proportional thereto such that a desired output transfer function is obtained.

2. The transversal filter of claim 1 wherein said capacitance of said first plurality of charge storage locations is less than any of the capacitances of said second plurality of charge storage locations.

3. The transversal filter of claim 2 wherein said semiconductor switches comprise junction field effect transistors.

4. The transversal filter of claim 2 wherein said semiconductor switches comprise metal-oxide-semiconductor field effect transistors.

5. The transversal filter of claim 2 wherein said summing means includes positive and negative current summing buss means for positive and negative weighting.

6. The transversal filter of claim 2 wherein the ratio of the capacitance at each of said second plurality of charge storage locations to the capacitance at said first plurality of charge storage locations is inversely proportional to the weighting factor desired at each of said second plurality of charge storage locations expressed as a fraction less than one.

* * * * *